(12) United States Patent
Maszara (10) Patent No.: US 6,444,534 B1
(45) Date of Patent: Sep. 3, 2002

(54) SOI SEMICONDUCTOR DEVICE OPENING IMPLANTATION GETTERING METHOD

(75) Inventor: Witold P. Maszara, Morgan Hill, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/772,649

(22) Filed: Jan. 30, 2001

(51) Int. Cl.[7] .............................................. H01L 21/331
(52) U.S. Cl. ...................................................... 438/311
(58) Field of Search ................................ 438/402, 143, 438/162, 407, 471, 473, 517, 310, 311

(56) References Cited

U.S. PATENT DOCUMENTS

| | | | |
|---|---|---|---|
| 3,936,858 A | 2/1976 | Seeds et al. ................. 357/23 |
| 4,371,403 A | * 2/1983 | Ikubo et al. ................. 148/1.5 |
| 4,498,227 A | 2/1985 | Howell et al. ............. 29/576 B |
| 5,194,395 A | 3/1993 | Wada ............................ 437/10 |
| 5,244,819 A | 9/1993 | Yue .............................. 437/11 |
| 5,272,104 A | 12/1993 | Schrantz et al. .............. 437/63 |
| 5,443,661 A | 8/1995 | Ogura et al. ............... 148/33.5 |
| 5,453,153 A | 9/1995 | Fan et al. ....................... 117/2 |
| 5,453,385 A | * 9/1995 | Shinji ......................... 437/11 |
| 5,501,993 A | 3/1996 | Borland ........................ 437/34 |
| 5,646,053 A | 7/1997 | Schepis et al. ............... 437/10 |
| 5,753,560 A | * 5/1998 | Hong et al. ................ 438/402 |
| 5,773,152 A | 6/1998 | Okonogi ..................... 428/446 |
| 5,795,809 A | 8/1998 | Gardner et al. ............. 438/402 |
| 5,807,771 A | 9/1998 | Vu et al. ..................... 438/154 |
| 5,818,085 A | 10/1998 | Hsu et al. ................... 257/347 |
| 5,882,990 A | 3/1999 | DeBusk et al. ............. 438/476 |
| 5,899,732 A | 5/1999 | Gardner et al. ............. 438/473 |
| 5,926,727 A | 7/1999 | Stevens et al. ............. 438/564 |
| 5,929,508 A | 7/1999 | Delgado et al. ............ 257/617 |
| 5,965,917 A | 10/1999 | Maszara et al. ............. 257/347 |
| 5,976,956 A | 11/1999 | Gardner et al. ............. 438/473 |
| 6,001,711 A | 12/1999 | Hashimoto .................. 438/473 |
| 6,010,950 A | 1/2000 | Okumura et al. ........... 438/455 |
| 6,013,584 A | 1/2000 | M'Saad ....................... 438/783 |
| 6,022,793 A | 2/2000 | Wijaranakula et al. ..... 438/473 |
| 6,024,888 A | 2/2000 | Watanabe et al. ............. 216/73 |
| 6,083,324 A | 7/2000 | Henley et al. ............. 148/33.2 |
| 6,093,624 A | 7/2000 | Letavic et al. .............. 438/462 |
| 6,100,202 A | 8/2000 | Lin et al. .................... 438/734 |
| 6,114,223 A | 9/2000 | Gonzalez et al. ........... 438/473 |
| 6,133,123 A | 10/2000 | Gonzalez .................... 438/525 |

OTHER PUBLICATIONS

"Basic Gettering Principles" (Crystalline Defects, Thermal Processing, and Gettering), *Silicon Processing For The VLSI Era*, Wolf and Tauber, vol. 1: Process Technology, pp. 63–70 (1986).

Improved SI–EPI–Wafers by Buried Damage Layer for Extrinsic Gettering; Dziesiatv and Wencel; Humboldt Univ. Of Berlin Section of Physics, unknown date.

Gettering Technique and Structure, IBM Technical Disclosure Bulletin 5/75.

"Nanoscale CMOS", *Proceedings of the IEEE*, Wong, et al., vol. 87, No. 4, Apr. 1999.

* cited by examiner

Primary Examiner—David Nelms
Assistant Examiner—Quoc Hoang
(74) Attorney, Agent, or Firm—Renner, Otto, Boisselle & Sklar, LLP (57) ABSTRACT

The present invention relates to a method of manufacturing a semiconductor device, including the steps of providing a silicon-on-insulator semiconductor wafer having a silicon film formed on an insulator layer; forming a semiconductor device in the silicon film, the semiconductor device including a semiconductor element, an interlayer dielectric over the semiconductor device, and at least one opening passing through the interlayer dielectric and in communication with the semiconductor element; implanting inert atoms into the semiconductor element by passing the inert atoms through the opening at an energy and at a dose sufficient to form a damaged region in the semiconductor element, wherein the oxide insulating layer acts as a mask to block implantation of the inert atoms into other portions of the semiconductor device, and the damaged region comprises gettering sites; and subjecting the semiconductor device to conditions to getter at least one impurity into the gettering sites from adjacent portions of the semiconductor device.

24 Claims, 4 Drawing Sheets

SOI SEMICONDUCTOR DEVICE OPENING IMPLANTATION GETTERING METHOD

TECHNICAL FIELD

The present invention generally relates to making silicon-on-insulator (SOI) semiconductor wafers, and in particular to a gettering method for use with an SOI semiconductor device.

BACKGROUND OF THE INVENTION

Recently, semiconductor-on-insulator (SOI) wafers increasingly have been used in very-large scale integration (VLSI) or ultra-large scale integration (ULSI) of semiconductor devices. An SOI wafer typically has a layer of silicon on top of a layer of an insulator material. In an SOI integrated circuit, essentially complete device isolation may be achieved using conventional device processing methods by surrounding each device, including the bottom of the device, with an insulator. One advantage which SOI wafers have over bulk silicon wafers is that the area required for isolation between devices on an SOI wafer is less than the area typically required for isolation on a bulk silicon wafer.

SOI offers other advantages over bulk silicon technologies as well. For example, SOI offers a simpler fabrication sequence compared to a bulk silicon wafer. Devices fabricated on an SOI wafer may also have better radiation resistance, less photo-induced current, and less cross-talk than devices fabricated on bulk silicon wafers. Devices within integrated circuits are very sensitive to the presence of even minute concentrations of some impurities. For example, metals, such as copper, nickel, silver, gold, or iron, within the active region of a device typically degrade several device characteristics, including leakage current and oxide breakdown voltage. These and other metals rapidly diffuse through bulk silicon at temperatures typical of semiconductor device fabrication processes. Such impurities in the active region of the SOI wafer migrate out of the active region more slowly than they migrate in bulk silicon because the insulation region tends to retard impurities in the active layer from diffusing into the bulk silicon beneath the insulation region. Some impurities which have migrated to, but have been retarded by the insulation region, may re-migrate into the whole of the active region during subsequent processing steps. Accordingly, SOI wafers are prone to device and reliability problems caused by the presence of impurities that remain in the active region.

Methods of gettering a silicon substrate are well known. Gettering is used to remove contaminants (usually heavy metals) from regions of the circuit where their presence would degrade device performance. Most all the transition metals, such as gold, copper, iron, titanium, nickel, etc., have been reported as possible contaminants. It is desirable to reduce the presence of such contaminants in the active regions in order to reduce, for example, reverse junction leakage, improve bipolar transistor gain, and increase refresh time in dynamic metal oxide semiconductor (MOS) memories. There are two common forms of gettering: intrinsic gettering and extrinsic gettering.

Intrinsic gettering involves forming gettering sites in the bulk of a semiconductor substrate, generally below the active regions near the frontside surface of the semiconductor substrate. In silicon substrates (wafers) manufactured using the Czochralski (Cz) method, intrinsic gettering generally includes an initial denuding step (for wafers without silicon epitaxial layers) followed by a nucleation step, and then a precipitation step. Denudation, nucleation, and precipitation, in combination, form lattice dislocations in the silicon bulk below the active regions. The dislocations serve to trap heavy metal ions at the dislocation sites, away from the overlying active regions.

Extrinsic gettering, on the other hand, generally involves gettering near the backside surface of a silicon substrate. There are several methods used to perform extrinsic gettering. Two common methods include (i) diffusing phosphorous into the backside surface of a silicon wafer, and/or (ii) depositing polycrystalline silicon (polysilicon) on the backside surface of a silicon wafer. Diffusion processes utilizing extrinsic gettering techniques such as backside phosphorous diffusion and polysilicon deposition is described in Runyan, et al., Semiconductor Integrated Circuit Processing Technology, (Addison-Wesley Publishing Co., 1990), pp. 428–442; and, DeBusk, et al., "Practical Gettering in High Temperature Processing", Semiconductor International, (May 1992) (both of which are herein incorporated by reference for their teachings relating to gettering).

Extrinsic gettering has been applied to the frontside surface of polycrystalline silicon wafers, in which phosphorus doping of contact layers is used to obtain frontside (or topside) gettering of diffused impurities or contaminants.

In SOI wafer technology, however, the use of polysilicon in direct contact with the back of the SOI wafer is not an effective gettering scheme, since the buried oxide layer will act as a diffusion barrier, causing contaminants to become trapped in the SOI film. The use of topside gettering by phosphorus doping of contact layers applied late in the fabrication process has not been effective in SOI technology due to the fact that it cannot prevent contamination during earlier stages of the process. Furthermore, since such topside gettering is applied late in the fabrication process, it can only protect portions of the circuit from which impurities can be gettered from above the device. Such gettering leaves the device susceptible to contaminants which later migrate from other portions covered by device elements from which the impurities cannot directly be gettered from the topside.

Once a device has been formed on an SOI semiconductor wafer, the problem of impurities in the active regions of the device remains, and the difficulty of gettering the impurities at this point in the fabrication process of the SOI semiconductor device is exacerbated by the presence of the device itself. In particular, in devices such as SOI MOSFETs, the source region, drain region, gate region and the portion of the body region which forms the channel region are vulnerable to the untoward effects of impurities in the semiconductor materials forming these regions. Furthermore, even when impurities have been gettered from the active region of an SOI wafer prior to fabrication of the semiconductor device thereon, the fabrication process may introduce impurities into the active region and/or portions of the semiconductor device itself. Thus, a method which getters impurities prior to formation of a semiconductor device, such as that disclosed in U.S. Pat. No. 5,753,560, fails to provide complete gettering in the semiconductor at or near completion of its fabrication.

The aforementioned problems resulting from both the nature of the SOI wafer and from the deficiencies in prior art gettering methods remain. The combination of these factors has presented a significant problem in gettering impurities from the active regions of SOI semiconductor devices at or near completion of the fabrication process. Thus, there has been a need for a method of gettering impurities from SOI semiconductor device at or near completion of the fabrication process.

SUMMARY OF THE INVENTION

A method of gettering of the active regions of semiconductor devices formed on SOI wafers is the subject of this application.

In a first embodiment, the present invention relates to a method of manufacturing a semiconductor device on an SOI wafer, comprising the steps of:

providing a silicon-on-insulator semiconductor wafer having a silicon film formed on an insulator layer;

forming at least one semiconductor device in the silicon film, the at least one semiconductor device including at least one semiconductor element, an interlayer dielectric over the semiconductor device, and at least one opening passing through the interlayer dielectric;

implanting inert atoms into one or more of the at least one semiconductor element by passing the inert atoms through the opening at an energy and at a dose sufficient to form a damaged region in one or more of the at least one semiconductor element, wherein the interlayer dielectric acts as a mask to block implantation of the inert atoms into other portions of the semiconductor device, and the damaged region comprises gettering sites; and subjecting the semiconductor device to conditions to getter at least one impurity into the gettering sites from adjacent portions of the semiconductor device.

In one embodiment, the opening passing through the interlayer dielectric is a contact hole in communication with the at least one semiconductor element. In one embodiment, the step of forming the semiconductor device further comprises a step of forming an electrically conductive silicide contact in communication with the opening and electrically connected to the at least one semiconductor element. In one embodiment, the at least one semiconductor element directly underlies the electrically conductive contact. In one embodiment, the at least one semiconductor element comprises a source or a drain of a MOSFET.

In one embodiment, the inert atom is one or more of helium, neon, argon, krypton, xenon, silicon and germanium.

In one embodiment, the inert atom is implanted at an energy sufficient to form the damaged region in two vertically adjacent semiconductor elements.

In one embodiment, the damaged region is formed directly below the opening. In one embodiment, the damaged region is formed substantially in alignment with the opening.

In one embodiment, the at least one impurity comprises a metal.

In one embodiment, the step of forming an interlayer dielectric includes forming an oxide insulating layer and a barrier layer.

In another embodiment, the present invention relates to a method of manufacturing a MOSFET, comprising the steps of:

providing a silicon-on-insulator semiconductor wafer having a silicon film formed on an insulator layer;

forming a MOSFET in the silicon film, the MOSFET including a source region, a drain region, an interlayer dielectric over the MOSFET, and contact holes passing through the interlayer dielectric and in communication with the source region and the drain region;

implanting inert atoms into the source region and the drain region by passing the inert atoms through the contact holes at an energy and at a dose sufficient to form damaged regions in the respective source region and drain region, wherein the interlayer dielectric acts as a mask to block implantation of the inert atoms into other portions of the MOSFET and the damaged region comprises gettering sites; and subjecting the MOSFET to conditions to getter at least one impurity into the gettering sites from adjacent portions of the MOSFET.

In one embodiment, the inert atom is implanted at an energy sufficient to form the damaged region in the source region, the drain region and in a further semiconductor element vertically adjacent each of the source region and the drain region. In one embodiment, the step of forming an interlayer dielectric includes forming an oxide insulating layer and a barrier layer.

Thus, the present invention provides a method for gettering active regions of a semiconductor device on an SOI wafer which addresses and overcomes the limitations of the prior art.

DETAILED DESCRIPTION

The present invention, in a first embodiment, relates to a method of manufacturing an SOI semiconductor device. In one embodiment, the SOI semiconductor device may be, for example an SOI MOSFET, either N-type or P-type. Although the present invention is described herein in terms of a MOSFET, in other embodiments, the SOI semiconductor device may be, for example, a bipolar transistor, a capacitor, a resistor, etc, formed on an SOI wafer. The SOI semiconductor device, according to the present invention, is formed on a silicon-on-insulator (SOI) wafer. The method of the present invention is particularly useful in the manufacturing process of SOI semiconductor devices fabricated upon an SOI wafer, but may be applied to other semiconductor devices.

As used herein, the term "impurity" refers to atoms or molecules which are not intended to be present in the particular semiconductor material. As used herein, an impurity does not include atoms or molecules which have been intentionally added to a semiconductor material and are intended to have a function in the semiconductor material, for example, as a dopant. Impurities, as used herein, are generally substances the presence of which may result in deleterious or unwanted effects in the performance of the semiconductor device in which such impurity may reside.

In the first step of the method of the present invention, a silicon-on-insulator (SOI) semiconductor wafer having at least one surface of a silicon film is provided. In one embodiment, the silicon film is a monocrystalline silicon film. As used herein, the term "monocrystalline" means a crystal lattice structure substantially without defects in the crystal structure and containing few impurities. The SOI wafer may be formed by any technique for forming such wafers, as described more fully below. the SOI wafer may have been subjected to gettering during its fabrication or early in the device fabrication process by other gettering methods.

Figure 1:
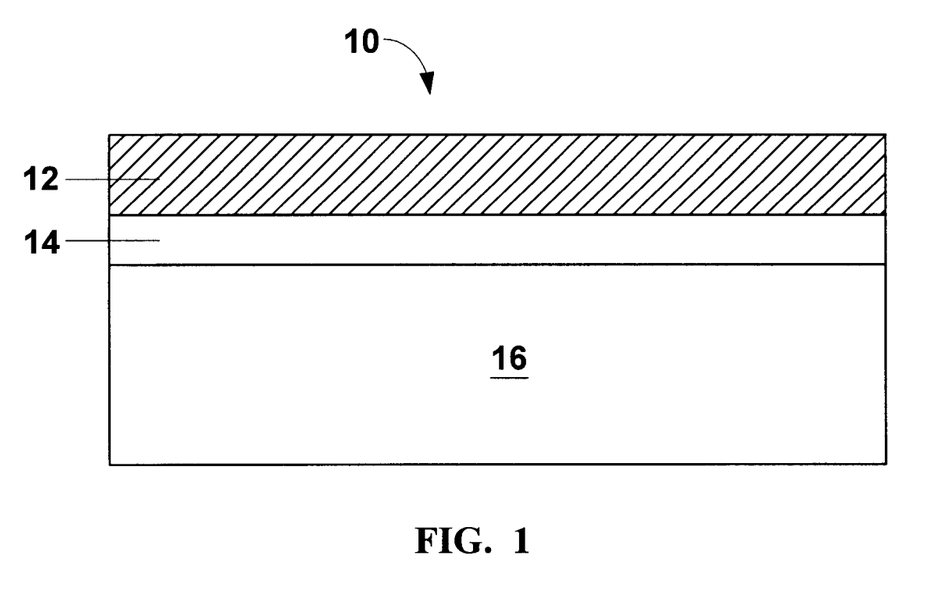
FIG. 1 is a schematic cross-sectional view of an SOI wafer.

FIG. 1 shows a partial cross-sectional view of an SOI wafer 10, with a silicon substrate layer 16, a buried oxide layer 14 and a silicon film 12. In one embodiment, the silicon film 12 is a monocrystalline silicon film. The SOI wafer 10 may be formed by any method known in the art. In one embodiment the SOI wafer 10 is formed by wafer bonding. In one embodiment, the SOI wafer is a silicon-on-sapphire (SOS) wafer. In one embodiment, the SOI wafer is made by a zone-melting-and-recrystallization (ZMR) method. In one embodiment, the SOI wafer is made by a "smart-cut" method. The present invention, as described herein, is applied to an already-formed SOI wafer, and thus is not limited to any particular method of forming the SOI wafer. More detailed descriptions of the foregoing methods of formation of SOI wafers may be found, for example, in Kuo, James B. and Ker-Wei Su, "CMOS VLSI Engineering Silicon-on-Insulator (SOI)", Kluwer Academic Publishers, 1998. This publication is incorporated herein by reference for its teachings of methods of formation of SOI wafers.

The second step of the present method comprises forming a semiconductor device on the SOI wafer 10. The SOI semiconductor device includes a semiconductor element, such as a source region or a drain region in an embodiment in which the SOI semiconductor device is an SOI MOSFET, which forms an active element of the SOI semiconductor device. Any active element, such as the source region, the drain region, and other parts forming and/or associated with the active elements, may include at least one impurity. The method used for forming the SOI semiconductor device may be any method known in the art. In one embodiment, the present invention is applicable to any semiconductor device which includes a structure which lends itself to the method of the present invention. The present invention is not limited to any particular method of making the semiconductor device.

Figure 2:
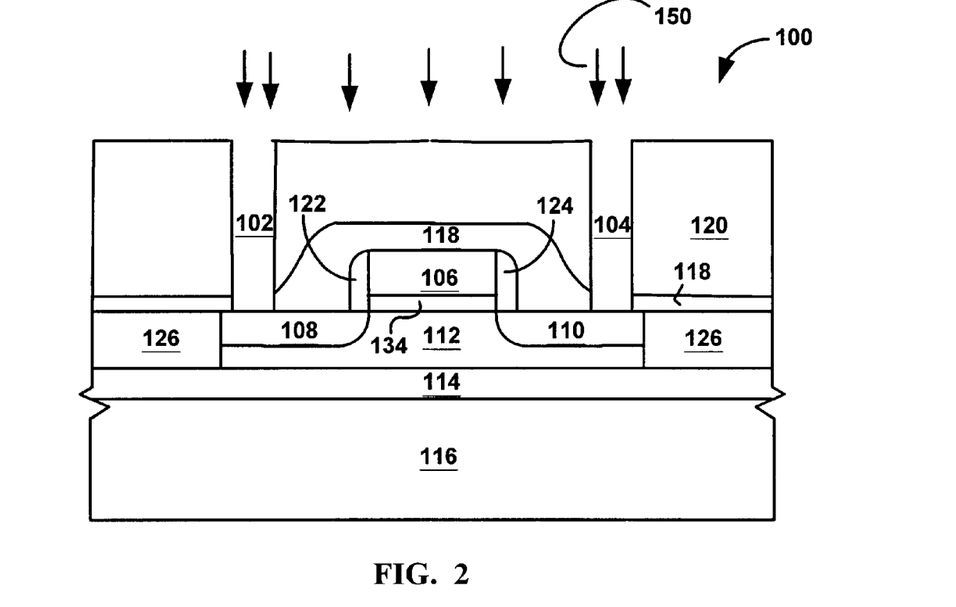
FIG. 2 is a schematic cross-sectional view of a first MOSFET on an SOI wafer, at the beginning of an implantation step in accordance with the present invention.

FIG. 2 depicts an SOI MOSFET semiconductor device 100, to which the method of the present invention may be applied. The structure 100 includes an oxide insulator layer 114 positioned over a silicon substrate layer 116. The substrate layer 116 may be amorphous, polycrystalline or monocrystalline silicon. The substrate layer 116 may be, for example, about 800 microns thick. The insulator layer 114 may be, for example, an oxide such as silicon dioxide. The insulator layer 114 surrounds a body region 112, which includes a channel region. The insulator layer 114 may be, for example, about 2000 Angstroms thick. A source region 108 and a drain region 110 are positioned within the body region 112, and a gate electrode 106 is positioned on an oxide layer 134 above the body region 112 so as to define the channel region between the source region 108 and the drain region 110. Side wall spacers 122 and 124 surround the gate electrode 106. Isolation structures 126 (e.g., trenches) are provided adjacent the SOI semiconductor device 100, to provide electrical insulation between adjacent SOI semiconductor devices.

The second step of the method of the present invention includes forming at least one interlayer dielectric over the SOI semiconductor device. In one embodiment, the interlayer dielectric comprises both a barrier layer and an oxide insulating layer formed over the SOI semiconductor device. After the at least one interlayer dielectric has been formed, openings may be formed in the oxide insulating layer and in the barrier layer. In one embodiment, the openings formed are contact holes for providing electrical contact to the semiconductor elements in the SOI semiconductor device. In one embodiment, the openings formed are contact holes for providing electrical contact from another part of the SOI semiconductor device to the semiconductor elements. In one embodiment, the openings formed are contact holes for providing electrical contact from an outside source to the semiconductor elements in the SOI semiconductor device.

In one embodiment, the openings may be vias formed for other purposes. In one embodiment, the openings formed may be vias formed for the purpose of introducing inert atoms for gettering impurities according to the method of the present invention, which openings are not intended to be contact holes for providing electrical connection to semiconductor elements..

In one embodiment, a barrier layer 118 and an oxide insulating layer 120 are formed over the insulator 114, the source region 108, the drain region 110, and the gate electrode 106 as shown in FIG. 2. Subsequent to forming the barrier layer 118 and the oxide insulating layer 120, openings such as contact holes 102 and 104 are formed. The contact holes 102 and 104 provide access for electrical connectors to the source region 108 and the drain region 110. Subsequent to application of the method of the present invention, electrical connectors will be fabricated in the contact holes 102 and 104 as appropriate. Methods for fabricating the barrier layer 118 and the oxide insulating layer 120 may include any method known in the art. The present invention is not limited to any particular method of fabricating the barrier layer 118 and the oxide insulating layer 120.

The contact holes 102 and 104, in one embodiment, are formed as a part of the process of forming the at least one interlayer dielectric. Thus, for example, in one embodiment, the at least one interlayer dielectric is formed over the entire surface of the SOI semiconductor device, and the contact holes 102 and 104 may be formed by etching the at least one interlayer dielectric at the appropriate location after appropriately protecting the portions of the at least one interlayer dielectric not to be etched. The method of forming the contact holes 102 and 104 is not limited, and may be any method known in the art.

In the third step of the method of the present invention, inert atoms are implanted into the semiconductor element. The inert atoms are implanted by passing the inert atoms through the opening at an energy and at a dose sufficient to form a damaged region in the semiconductor element below the opening. In FIG. 2, the inert atoms are shown schematically by arrows 150 being directed into the contact holes 102 and 104 and elsewhere over the outer surface of the oxide insulating layer 120. As will be understood, the arrows 150, like the inert atoms they represent, are primarily directed towards the contact holes 102 and 104, but some portion of the inert atoms will strike and be implanted into the oxide insulating layer 120. Thus, the oxide insulating layer 120 acts as a mask, preventing the inert atoms from becoming implanted in, and thereby possibly affecting the operation of, any other part of the SOI semiconductor device. Thus, in this step, the oxide insulating layer acts as a mask to block implantation of the inert atoms into other portions of the SOI semiconductor device. The damaged region formed by the step of implanting inert atoms includes defects and dislocations which constitute gettering sites.

The inert atom used in the method of the present invention may be one or more of helium, neon, argon, krypton, xenon, silicon and germanium. While neither silicon nor germanium are normally considered as an "inert atom", they are included in the group of inert atoms in the present invention because both silicon and germanium are non-reactive to and do not dope, i.e., are inert to, the semiconductor element into which they are implanted, when the semiconductor element primarily is comprised of silicon. Thus, any atom which neither reacts with nor dopes silicon may be used as the inert atom in the present invention. In other embodiments, the semiconductor element may be doped silicon, i.e., n-type silicon or p-type silicon. In these other embodiments, the inert atom substantially should not alter the doped character of the silicon.

In one embodiment, the inert atom is implanted at an energy sufficient to form the damaged region at a lower side of the semiconductor element. Thus, when the semiconductor element into which the inert atoms are implanted has a thickness which is greater than a thickness of the nascent damaged region, the damaged region may be selectively implanted at different levels in the thickness dimension. Implanting the inert atoms, and forming the damaged region at a selected level is advantageous since the impurities gettered into the damaged region may be drawn away from, e.g., the adjacent active regions of the SOI semiconductor device.

The inert atoms may be implanted by any implantation device known in the semiconductor art. The present invention is not limited to any particular form of implantation, nor to any particular implantation device. Such devices are well known to those of skill in the art.

The energy of implantation generally ranges from about 2 to about 200 KeV for implantation into a film having a thickness in the range from about 500 Å to about 3000Å. The exact energy depends, inter alia, on the inert atom, the nature and thickness of the target layer, the depth to which the inert atom is to be implanted, and the degree of damage sought. When the inert atom is a light element such as helium, the implantation energy may be relatively low, while still obtaining a desired depth of implantation. Conversely, a heavy element such as xenon requires a significantly higher energy to obtain the same desired depth of implantation in the same target. Persons of skill in the art can easily determine the implantation energy based on the desired depth of implantation, the particular inert atom to be implanted, and the degree of damage sought. In any case, the energy of implantation should be such that the degree of damage is well below that which would render the silicon target amorphous.

In one embodiment, the energy of implantation for helium ranges from about 2 KeV to about 20 KeV. In one embodiment, the energy of implantation for neon ranges from about 20 KeV to about 50 KeV. In one embodiment, the energy of implantation for argon ranges from about 40 KeV to about 100 KeV. In one embodiment, the energy of implantation for xenon ranges from about 60 KeV to about 140 KeV. In one embodiment, the energy of implantation for krypton ranges from about 120 KeV to about 200 KeV.

The interlayer dielectric generally is a material which absorbs the inert atoms, and which thereby acts as a mask to prevent implantation of the inert atoms into regions of the semiconductor device covered by the interlayer dielectric. Since the inert atoms are directed to the semiconductor device in a collimated beam, the inert atoms being directed into the opening results in implantation of the inert atoms in a restricted area of the semiconductor element. In one embodiment, the damaged region is formed directly below the opening. In one embodiment, the damaged region is formed substantially in alignment with the opening. In one embodiment, the damaged region is formed directly in line with the opening, and does not extend outwardly from an area of approximately equal diameter or cross-sectional area as the opening. Thus, the cross-sectional area of the damaged region is approximately the same as the cross-sectional area of the opening. As will be understood, one important factor in determining the extent of the damaged region, is the degree of collimation of the inert atom stream. If the inert atoms arrive at the surface of the SOI semiconductor device in a collimated beam, the beam may be selectively directed into the opening, so that the position and size of the damaged area may be selected and controlled precisely and accurately.

Figure 3:
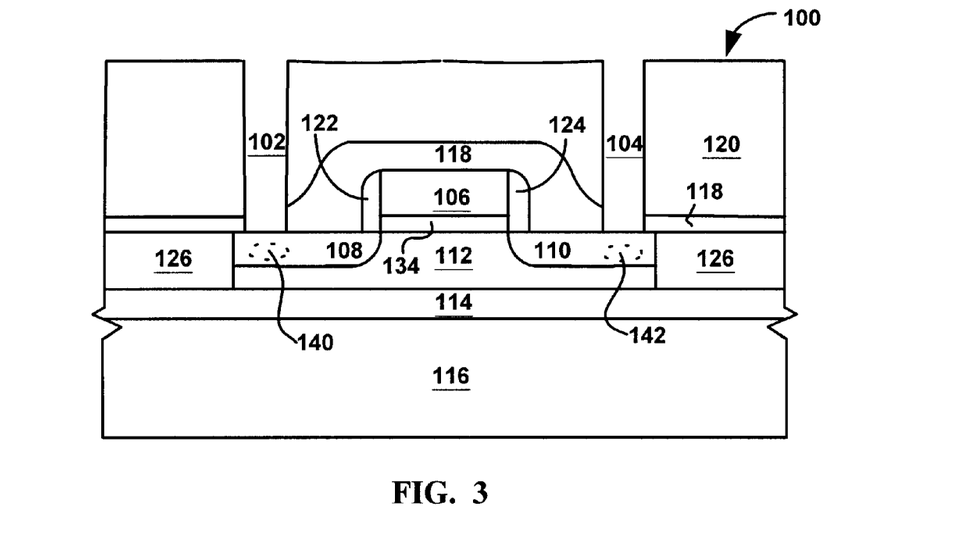
FIG. 3 is a schematic cross-sectional view of one embodiment of the MOSFET of FIG. 2 following an implantation step in accordance with the present invention.

FIG. 3 shows one embodiment of the SOI semiconductor device of FIG. 2 following the step of implanting inert atoms, in which damaged regions 140 and 142 have been formed. In the embodiment of FIG. 3, the inert atoms have been implanted into a semiconductor element, to form the damaged regions 140 and 142 in the source region 108 and the drain region 110, respectively. In this embodiment, the damaged regions 140 and 142 include gettering sites into which will be gettered impurities primarily from the source region 108 and the drain region 110. While some impurities may be gettered from the body region 112 adjacent the source and drain regions, a relatively smaller amount of impurities will be gettered from the body region 112. In actual practice, damaged regions may be formed which are larger or smaller, or in different vertical positions (i.e., the vertical direction in the plane of the paper), than the damaged regions 140 and 142 shown in FIG. 3. The size and vertical position of the damaged regions formed may be controlled by varying the energy and/or dose of implantation and/or by selection of the specific inert atom or atoms which are used in the implantation.

Figure 4:
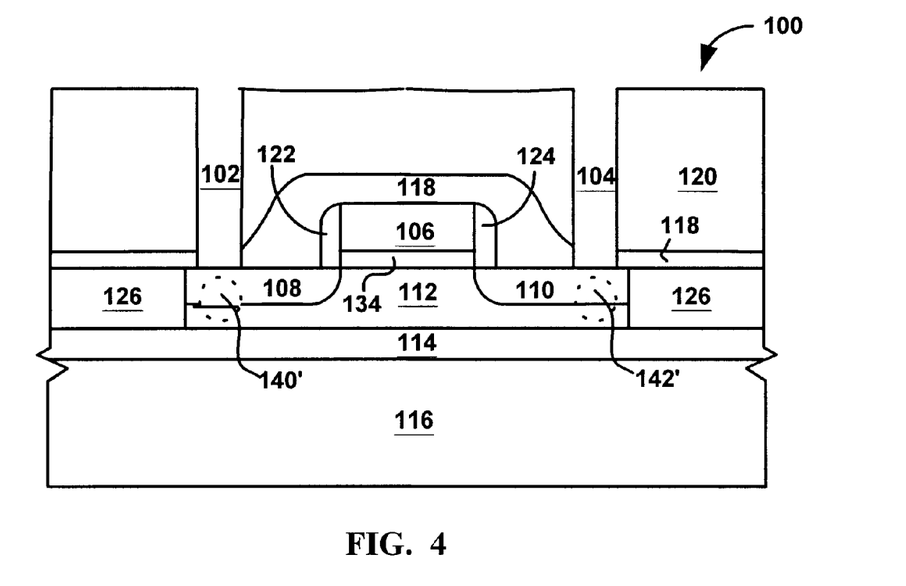
FIG. 4 is a schematic cross-sectional view of another embodiment of the MOSFET of FIG. 2 following an implantation step in accordance with the present invention.

FIG. 4 shows another embodiment of the SOI semiconductor device of FIG. 2 following the step of implanting inert atoms, in which damaged regions 140' and 142' have been formed. In the embodiment of FIG. 4, the inert atoms have been implanted into two semiconductor elements, to form the damaged region 140' extending from a portion of the source region 108 into a vertically adjacent portion of the body region 112, for example, directly below the portion of the source region 108, and to form the damaged region 142' extending from a portion of the drain region 110 into a vertically adjacent portion of the body region 112, for example, directly below the portion of the drain region 110. In the embodiment shown in FIG. 4, the damaged regions 140' and 142' include gettering sites into which will be gettered impurities from the source region 108, the drain region 110 and adjacent portions of the body region 112. In this embodiment, impurities may be gettered from both the source region 108 and the adjacent body region 112, and from the drain region 110 and the adjacent body region 112. Impurities may also be gettered from adjacent portions of the semiconductor device. In the embodiment shown in FIG. 4, the size and vertical extent of the damaged regions formed has been enlarged by increasing one or more of the energy and/or dose of implantation and/or by selection of the specific inert atom or atoms which are used in the implantation.

Figure 5:
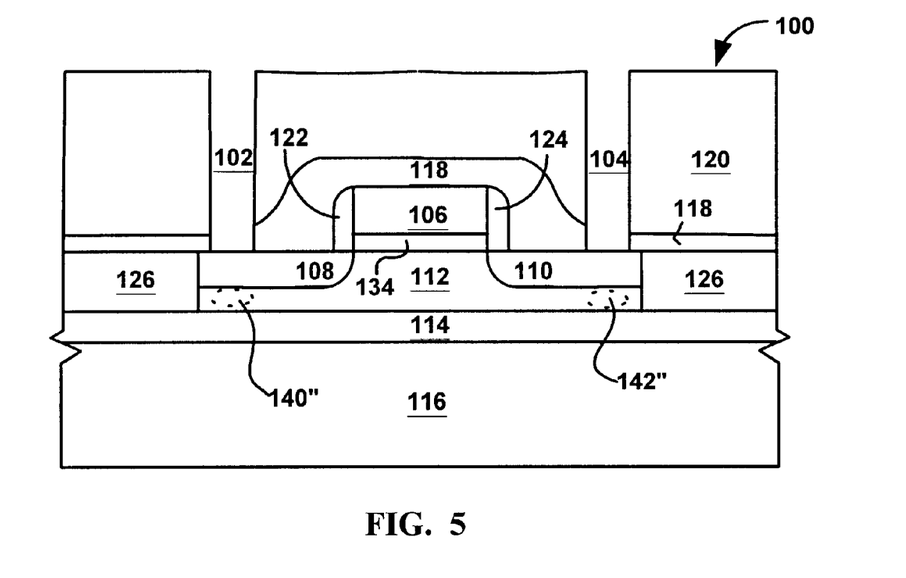
FIG. 5 is a schematic cross-sectional view of yet another embodiment of the MOSFET of FIG. 2 following an implantation step in accordance with the present invention.

FIG. 5 shows yet another embodiment of the SOI semiconductor device of FIG. 2 following the step of implanting inert atoms, in which damaged regions 140" and 142" have been formed. In the embodiment of FIG. 5, the inert atoms have been implanted into a semiconductor element, to form the damaged regions 140" and 142" in portions of the body region 112 below the source region 108 and the drain region 110, respectively. In the embodiment of FIG. 5, the damaged regions 140 " and 142 " include gettering sites into which will be gettered impurities primarily from the body region 112. While some impurities may be gettered from the adjacent source region 108 and adjacent drain region 110, a relatively smaller amount of impurities will be gettered from the adjacent source region 108 and adjacent drain region 110. In actual practice, damaged regions may be formed which are larger or smaller, or in a different vertical position, than the damaged regions 140" and 142" shown in FIG. 5. In the embodiment shown in FIG. 5, the vertical position of the damaged regions 140" and 142" formed by the implantation of inert atoms has been controlled by increasing the energy and/or dose of implantation and/or by selection of the specific inert atom or atoms which are used in the implantation.

In each of the foregoing embodiments, it is important to note that the damaged regions, and thereby the gettering sites into which will be gettered the impurities, are located away from the p/n junctions and away from the gate oxide. Locating the damaged regions away from the p/n junctions and away from the gate oxide insures that any impurities present will be gettered away from these important locations, and that the semiconductor device will be protected thereby from any deleterious effects which might result from the presence of such impurities in these important locations.

The dose of the inert atom should be sufficient to obtain the degree of damage desired. The dose required is approximately inversely proportional to the mass of the inert atom being implanted. Thus, when helium is employed as the inert atom, a dose about 100 times higher is required to obtain the same degree of damage obtained from xenon. In one embodiment, the dose of the inert atom is in the range from about $1\times10^{13}/cm^2$ (1e13/$cm^2$) to about $1\times10^{15}/cm^2$ (1e15/$cm^2$). In one embodiment, the dose of the inert atom is in the range from about $1\times10^{11}/cm^2$ (1e12/$cm^2$) to about $1\times10^{17}/cm^2$ (1e17/$cm^2$). In one embodiment, the dose of the inert atom is in the range from about $1\times10^{12}/cm^2$ (1e12/$cm^2$) to about $1\times10^{16}/cm^2$ (1e16/$cm^2$). In one embodiment, the dose of the inert atom is in the range from about $5\times10^{13}/cm^2$ (5e13/$cm^2$) to about $5\times10^{14}/cm^2$ (5e14/$cm^2$). In one embodiment, the dose of the inert atom is in the range from about $1\times10^{14}/cm^2$ (1e14/$cm^2$) to about $5\times10^{15}/cm^2$ (5e15/$cm^2$).

In the fourth step of the method of the present invention, the semiconductor device formed on the SOI wafer is subjected to gettering conditions in order to getter impurities from the adjacent portions of the SOI semiconductor device into the gettering sites. The adjacent portions of the SOI semiconductor device may include the source region 108, the drain region 110 and the bulk region 112 including the channel region. The gettering step of the present invention is conventional gettering, in which the SOI semiconductor device 100 is subjected to temperatures in the range from about 600° C. to about 900° C. for periods of about 1 to about 5000 minutes, in order to cause impurities, such as metal ions, in the adjacent portions of the SOI semiconductor device to migrate into the gettering sites within the damaged region. In one embodiment, the gettering step is carried out at a temperature of about 600° C. In one embodiment, the gettering step is carried out at a temperature of about 700° C. In one embodiment, the gettering step is carried out at a temperature of less than about 800° C. In one embodiment, the gettering step is carried out at a temperature in the range from about 600° C. to about 750° C.

The exact temperature at which gettering takes place depends upon the impurities which are to be gettered. Since gettering is a process of moving impurity atoms or ions through the crystal lattice of the silicon film, the rate at which the impurities move is a function of both the temperature and the solubility of the impurities in the silicon. Thus, the exact temperature at which gettering takes place depends upon the particular impurities which are desired to be gettered, as will be understood by those of skill in the art. Such persons can easily determine the exact conditions at which the desired gettering takes place.

As will be understood, since in the present invention the implantation and gettering are carried out after the semiconductor device has been completely fabricated, or when the device has been substantially completely fabricated, the device cannot safely be subjected to unduly high temperatures. The gettering temperature is generally lower than a temperature required for recrystallization of the semiconductor, since such temperatures may damage the semiconductor device. Thus, the degree of damage should be limited as should the gettering temperature. As will be further understood, as time and temperature of gettering are increased, the relative speed of gettering of any particular species generally increases. At higher temperatures, shorter times may be used, and conversely, at lower temperatures, longer times may be required, in order to obtain the same degree of gettering of a given species.

In one embodiment, the gettering step is carried out in an inert atmosphere to ensure the purity of the silicon wafer is maintained. In one embodiment, the gettering step is carried out in nitrogen. In one embodiment, the gettering step is carried out in argon. In one embodiment, the gettering is carried out in air. In one embodiment, the gettering is carried out in an oxidizing atmosphere. In one embodiment, the gettering is carried out in an reducing atmosphere. In one embodiment, the gettering step is carried out at atmospheric pressure. In one embodiment, the gettering step is carried out at sub-atmospheric pressure.

In the illustrated embodiment, the gettering step results in the migration of isolated impurity atoms or molecules into gettering sites in the damaged regions 140 and 142. In one embodiment, the gettering step results in the migration of isolated impurity atoms or molecules from the source region 108, the drain region 110 and the body region 112 into gettering sites in the damaged regions 140 and 142. The gettering sites, as is known in the art, include, e.g., dislocations, crystal defect sites and other damage existing in the damaged regions 140 and 142, resulting from the implanting of inert ions into the semiconductor element.

In one embodiment, the third and fourth steps occur substantially simultaneously. In one embodiment, the third and fourth steps occur during the same processing step. That is, the step of implanting the inert atoms, and the step of subjecting the wafer to conditions to getter at least one impurity from the SOI semiconductor device into the gettering site, occur together, under the same conditions. The term "substantially simultaneously" means that the step of forming a gettering site is not detectably separate from the step of subjecting the wafer to gettering conditions. The phrase "during the same processing step" means that the conditions under which the inert atoms are implanted are essentially the same conditions to getter the at least one impurity into the gettering site, and that carrying out the third step results in carrying out the fourth step. In this embodiment, it may be understood that a gettering site must exist before an impurity may be captured by the gettering site. However, the migration of the impurities, which eventually results in the impurity "finding" and being "captured by" a gettering site, may be considered to co-occur with the formation of the gettering sites. In one embodiment, when the inert atoms are implanted at a temperature of about 600° C. to about 800° C., gettering takes place substantially simultaneously. In one embodiment, when the inert atoms are implanted at a temperature of about 600° C. to about 800° C., gettering takes place during the same processing step.

In one embodiment, the third step and the fourth step occur sequentially. In an embodiment in which the step of implanting the inert atoms occurs at a temperature lower than a temperature which results in occurrence of gettering, the gettering step is performed by subsequently raising the temperature to a temperature at which gettering takes place. Thus, in this embodiment, the gettering step may be undertaken at a later time and/or in a separate apparatus. In one embodiment, the temperature under which the implantation takes place is lower than needed for gettering to take place, in which case the gettering step is a separate step from the implanting step.

The impurities which may be gettered include metals. In one embodiment, the metals include the transition metals. In one embodiment, the metals include heavy metals. In one embodiment, the metals which may be gettered include heavy metals. In one embodiment, the metals which may be gettered include one or more metals such as nickel, palladium, platinum, copper, silver, gold, palladium, ruthenium, chromium, tantalum, iron, cobalt, tungsten, lead, zinc, tin, zirconium, titanium, vanadium, manganese, aluminum, niobium and tantalum. In one embodiment, the metallic impurities may include compounds of the foregoing metals, such as oxides or sulfides.

In one embodiment, the concentration of the impurities which are to be gettered range from about $1 \times 10^{11}/cm^3$ to about $1 \times 10^{18}/cm^3$. In one embodiment, the concentration of the impurities which are to be gettered range from about $1 \times 10^{13}/cm^3$ to about $1 \times 10^{17}/cm^3$. In one embodiment, the concentration of the impurities which are to be gettered range from about $1 \times 10^{15}/cm^3$ to about $1 \times 10^{16}/cm^3$ or higher. The level of impurities prior to gettering depends on, e.g., the cleanliness of the process by which the SOI wafer is produced.

Following the gettering, the concentration of the impurities in the regions of the SOI semiconductor device adjacent the damaged region should be reduced close to a level at which they are not detectable. In one embodiment, the at least one impurity is not detectable in the portions of each of the source region, the drain region and the body region adjacent the p/n junctions and the gate oxide following the gettering step. In one embodiment, the concentration of the at least one impurity in these portions of each of the source region, the drain region and the body region is reduced to about $1 \times 10^8/cm^3$ to about $1 \times 10^{10}/cm^3$ by the gettering step. As will be understood by those of skill in the art, the lower limit of detection of a given impurity depends on the sensitivity of available analytical techniques applicable to that impurity, and this level varies for different impurities. Of course, the lower limit of detection may be reduced by subsequent improvements in analytical techniques. In addition, as will be understood by those of skill in the art, the degree of reduction of the concentration of a given impurity depends on the relative solubility and diffusibility of that impurity in the monocrystalline silicon film.

In one embodiment, the method of the present invention is applied to a MOSFET device. In this embodiment, the method is applied in the manufacturing a MOSFET, in which the method includes, as a first step, providing an SOI semiconductor wafer having a silicon film formed on an insulator layer. In the next step of the method, a MOSFET is formed in the silicon film. The MOSFET so formed may include, inter alia, a source region, a drain region, an interlayer dielectric over the MOSFET, and opening s passing through the interlayer dielectric and in communication with the source region and the drain region. Thereafter, inert atoms are implanted into the source region and the drain region by passing the inert atoms through the openings at an energy and at a dose sufficient to form damaged regions in the source region and the drain region below the respective openings. In this step, the interlayer dielectric acts as a mask to block implantation of the inert atoms into other portions of the MOSFET. The damaged region includes a number of gettering sites. Thereafter, the MOSFET is subjected to conditions to getter at least one impurity into the gettering sites from adjacent portions of the MOSFET. Thereafter, the MOSFET and the semiconductor device as a whole may be further processed to complete fabrication of the semiconductor device.

In one embodiment, in the method of the present invention, the step of forming the SOI semiconductor device further includes a step of forming an electrically conductive contact in communication with the opening and electrically connected to the semiconductor element. In one embodiment, the electrically conductive contact is a silicide. In one embodiment, the silicide is titanium silicide and in one embodiment, the silicide is cobalt silicide. In one embodiment, the semiconductor element directly underlies the electrically conductive contact.

Figure 6:
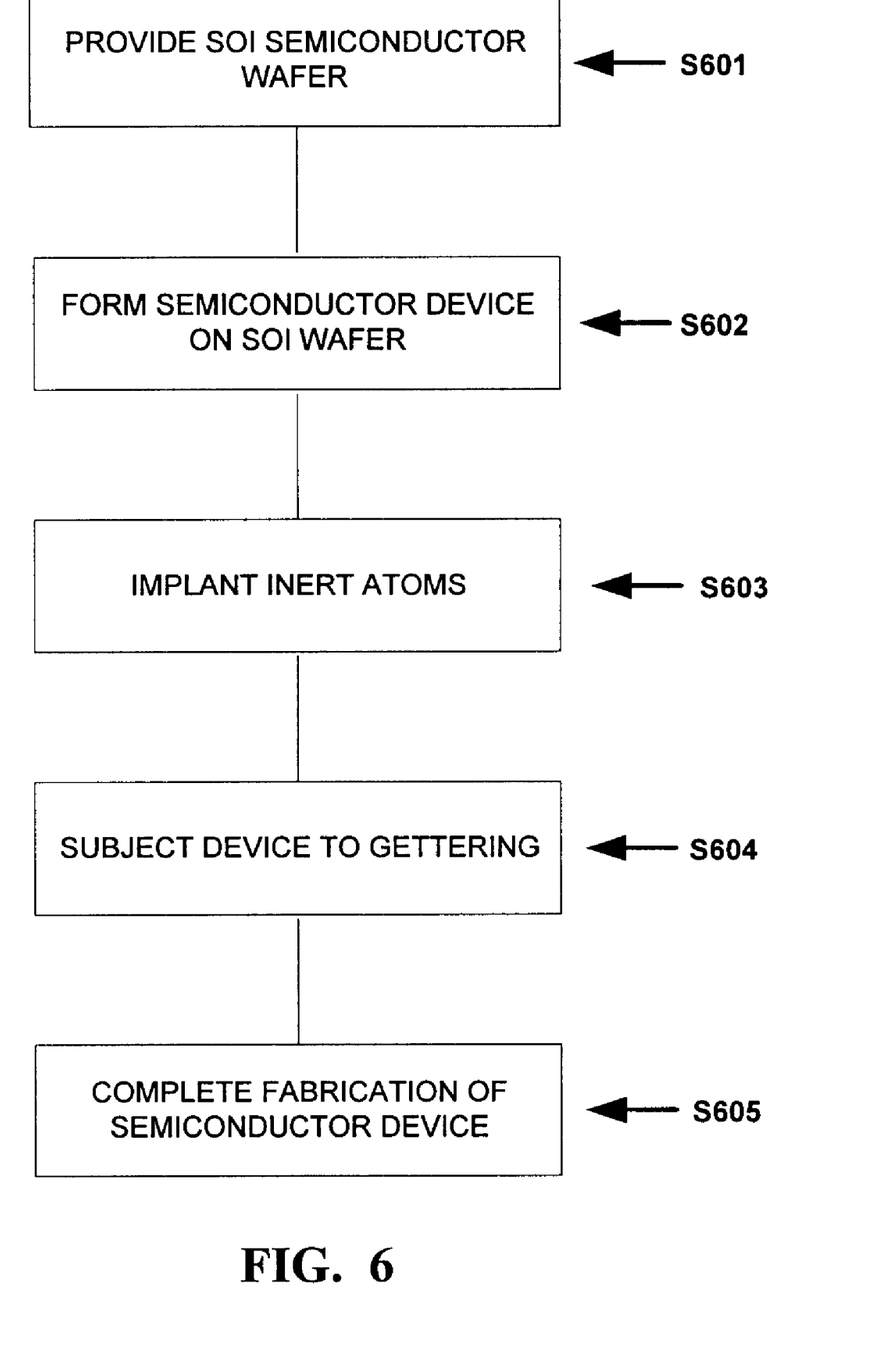
FIG. 6 is a flowchart illustrating process steps of the present invention.

FIG. 6 is a flowchart illustrating the fundamental process steps of the present invention. As shown in FIG. 6, the method of manufacturing a semiconductor device according to the present invention includes a first step, S601, in which an SOI semiconductor wafer having a silicon film formed on an insulation layer is provided. The SOI semiconductor wafer may be formed by any method for forming such an SOI wafer.

As shown in FIG. 6, in the method of the present invention, a second step S602 includes forming a semiconductor device. The semiconductor device thus formed includes a semiconductor element, an interlayer dielectric over the semiconductor device, and at least one opening passing through the interlayer dielectric. In one embodiment, the opening is a contact hole. The semiconductor device may include additional elements, such as source, drain and gate electrodes, a body region in which a gate channel may be formed, and other elements known to those of skill in the art. In one embodiment, the step S602 may include forming an electrically conductive contact in communication with the opening and electrically connected to the semiconductor element. In one embodiment, the semiconductor element is a source region or a drain region of a MOSFET semiconductor device. In one embodiment, the semiconductor element directly underlies the electrically conductive contact. In one embodiment, the interlayer dielectric includes both an oxide insulating layer and a barrier layer.

As shown in FIG. 6, in the method of the present invention, a third step S603 includes implanting inert atoms into the semiconductor element of the semiconductor device. The implantation may be by any means known to those of skill in the art. The implantation is carried out by passing the inert atoms through the opening passing through the interlayer dielectric. The implantation is carried out by implanting the inert atoms at an energy and at a dose sufficient to form a damaged region in the semiconductor element. The damaged region so formed includes gettering sites, into which impurities will be gettered subsequently. During the implantation, the interlayer dielectric acts as a mask to block implantation of inert atoms into other portions of the semiconductor device. The inert atoms implanted in the step S603 may be one or more of helium, neon, argon, krypton, xenon, silicon and germanium. The damaged region formed in step S603 may be generally aligned with the opening through which the inert atoms are passed. In one embodiment, the damaged region is formed substantially in alignment with the opening. In one embodiment, the damaged region is formed directly below the opening. The damaged region may be formed in a lower portion of the semiconductor element.

As shown in FIG. 6, in the method of the present invention, a fourth step S604 includes subjecting the semiconductor device to conditions under which at least one impurity is gettered into the gettering sites in the damaged region formed in the step S603. The impurities are gettered into the gettering sites from portions of the semiconductor device adjacent the damaged regions. The impurities which may be gettered include metals.

The foregoing steps, summarized as steps S601–S604 shown in FIG. 6 and described above, constitute the basic steps of the method of the present invention. Thereafter, as shown in FIG. 6, in step S605, further processing of the semiconductor device to complete the fabrication process may be undertaken. The further processing in step S605 may include, for example, filling the openings through which the inert atoms have been passed for implantation into the semiconductor element. In an embodiment in which the openings are contact holes, the contact holes may be filled with an electrical conductor for providing an electrical connection to the semiconductor element, such as the source or drain of a MOSFET. In an embodiment in which the opening is a via formed for the purpose of providing a passageway through which inert atoms may be passed for implantation into selected portions of a semiconductor element, the opening may be filled either with an electrically conducting material, if the semiconductor element in communication with the opening is not an electrically active element of the semiconductor device, or by a non-conductive or dielectric material, when the semiconductor element in communication with the opening is or may be an electrically active element of the semiconductor device. The step S605 may include other process steps, as understood by those of skill in the art. The process steps which may be included in the step S605 are not essential to the present invention.

What has been described above are certain embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of manufacturing a semiconductor device, comprising the steps of:

providing a silicon-on-insulator semiconductor wafer having a silicon film formed on an insulator layer;

forming at least one semiconductor device in the silicon film, the at least one semiconductor device including an active semiconductor element, an interlayer dielectric over the semiconductor device, and at least one opening passing through the interlayer dielectric and in communication with the active semiconductor element;

implanting inert atoms into one or more of the active semiconductor clement by passing the inert atoms through the opening at an energy and at a dose sufficient to form a damaged region in the active semiconductor element, wherein the interlayer dielectric acts as a mask to block implantation of the inert atoms into other portions of the semiconductor device, and the damaged region comprises gettering sites; and subjecting the semiconductor device to conditions to getter at least one impurity into the gettering sites from adjacent portions of the semiconductor device.

2. The method of claim 1, wherein the opening is a contact hole in communication with the active semiconductor element.

3. The method of claim 1, wherein the step of forming the semiconductor device further comprises a step of forming an electrically conductive silicide contact in communication with the opening and electrically connected to the active semiconductor element.

4. The method of claim 3, wherein the active semiconductor element directly underlies the electrically conductive silicide contact.

5. The method of claim 4, wherein the active semiconductor element comprises a source or a drain of a MOSFET.

6. The method of claim 1, wherein the inert atom is one or more of helium, neon, argon, krypton, xenon, silicon and germanium.

7. The method of claim 1, wherein the inert atom is implanted at an energy sufficient to form the damaged region in two vertically adjacent semiconductor elements.

8. The method of claim 1, wherein the damaged region is formed directly below the opening.

9. The method of claim 1, wherein the damaged region is formed substantially in alignment with the opening.

10. The method of claim 1, wherein the at least one impurity comprises a metal.

11. The method of claim 1, wherein the interlayer dielectric comprises an oxide insulating layer and a barrier layer.

12. The method according to claim 1, wherein the conditions to getter at least one impurity comprise subjecting the semiconductor device to an elevated temperature lower than a temperature required for recrystallization of the semiconductor.

13. The method according to claim 1, wherein the conditions to getter at least one impurity comprise subjecting the semiconductor device to a temperature in the range from about 600° C. to about 900° C.

14. A method of manufacturing a MOSFET, comprising the steps of:

providing a silicon-on-insulator semiconductor wafer having a silicon film formed on an insulator layer;

forming a MOSFET in the silicon film, the MOSFET including a source region, a drain region, an interlayer dielectric over the MOSFET, and contact holes passing through the interlayer dielectric and in communication with the source region and the drain region;

implanting inert atoms into the source region and the drain region by passing the inert atoms through the contact holes at an energy and at a dose sufficient to form damaged regions in the respective source region and drain region, wherein the interlayer dielectric acts as a mask to block implantation of the inert atoms into other portions of the MOSFET and the damaged region comprises gettering sites; and subjecting the MOSFET to conditions to getter at least one impurity into the gettering sites from adjacent portions of the MOSFET.

15. The method of claim 14, wherein the step of forming the MOSFET further comprises a step of forming electrically conductive contacts in communication with the contact holes and electrically connected respectively to the source region and the drain region.

16. The method of claim 15, wherein the electrically conductive contact is a silicide.

17. The method of claim 14, wherein the at least one impurity comprises a metal.

18. The method of claim 14, wherein the inert atom is one or more of helium, neon, argon, krypton, xenon, silicon and germanium.

19. The method of claim 14, wherein the inert atom is implanted at an energy sufficient to form the damaged region in the source region, the drain region, and in a further semiconductor element vertically adjacent each of the source region and the drain region.

20. The method of claim 14, wherein the damaged region is formed directly below the contact hole.

21. The method of claim 20, wherein the damaged region is formed substantially in alignment with the contact hole.

22. The method of claim 14, wherein the step of forming includes forming the interlayer dielectric to comprise an oxide insulating layer and a barrier layer.

23. The method according to claim 14, wherein the conditions to getter at least one impurity comprise subjecting the MOSFET to an elevated temperature lower than a temperature required for recrystallization of the semiconductor.

24. The method according to claim 14, wherein the conditions to getter at least one impurity comprise subjecting the MOSFET to a temperature in the range from about 600° C. to about 900° C.

* * * * *

UNITED STATES PATENT AND TRADEMARK OFFICE
CERTIFICATE OF CORRECTION

PATENT NO. : 6,444,534 B1
DATED : September 3, 2002
INVENTOR(S) : Maszara It is certified that error appears in the above-identified patent and that said Letters Patent is hereby corrected as shown below:

Column 14,
Line 13, replace "clement" with -- element --

Signed and Sealed this

Eleventh Day of February, 2003

JAMES E. ROGAN
*Director of the United States Patent and Trademark Office*